(12) United States Patent
He et al.

(10) Patent No.: US 12,243,580 B2
(45) Date of Patent: Mar. 4, 2025

(54) FIN FIELD EFFECT TRANSISTOR SENSE AMPLIFIER CIRCUITRY AND RELATED APPARATUSES AND COMPUTING SYSTEMS

(71) Applicant: Micron Technology, Inc., Boise, ID (US)

(72) Inventors: Yuan He, Boise, ID (US); Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 148 days.

(21) Appl. No.: 17/936,760

(22) Filed: Sep. 29, 2022

(65) Prior Publication Data
US 2024/0112724 A1   Apr. 4, 2024

(51) Int. Cl.
*G11C 11/00*      (2006.01)
*G11C 11/4091*  (2006.01)
(Continued)

(52) U.S. Cl.
CPC ...... *G11C 11/4091* (2013.01); *H01L 25/0657* (2013.01); *H01L 25/18* (2013.01)

(58) Field of Classification Search
CPC ....... G11C 7/065; G11C 7/12; G11C 11/4091; G11C 11/4097; G11C 7/08; G11C 7/06; G11C 7/062; G11C 7/18; G11C 11/4085; G11C 11/4094; G11C 2207/002; G11C 8/14; G11C 11/419; G11C 11/1673; G11C 13/0002; G11C 13/0007; G11C 13/004; G11C 5/025; G11C 7/067; G11C 8/08; G11C 11/401; G11C 11/412; G11C 11/413; G11C 2211/4016; G11C 5/148;
(Continued)

(56) References Cited

U.S. PATENT DOCUMENTS

2020/0342918 A1 * 10/2020 Bringivijayaraghavan ............... G11C 11/412
2023/0005816 A1   1/2023 Simsek-Ege
(Continued)

OTHER PUBLICATIONS

He et al., "Microelectronic Devices Including Control Logic Circuitry Overlying Memory Arrays, and Related Memory Devices and Electronic Systems", filed Aug. 29, 2022, U.S. Appl. No. 17/898,150, 47 pages.
(Continued)

*Primary Examiner* — Thong Q Le
(74) *Attorney, Agent, or Firm* — TraskBritt

(57) ABSTRACT

Fin field effect transistor (FinFET) sense amplifier circuitry and related apparatuses and computing systems are disclosed. An apparatus includes a pull-up sense amplifier, a pull-down sense amplifier, column select gates, global input-output (GIO) lines, and GIO pre-charge circuitry. The pull-up sense amplifier includes P-type FinFETs having a first threshold voltage potential associated therewith. The pull-down sense amplifier includes N-type FinFETs having a second threshold voltage potential associated therewith. The second threshold voltage potential is substantially equal to the first threshold voltage potential. The GIO lines are electrically connected to the pull-up sense amplifier and the pull-down sense amplifier through the column select gates. The GIO pre-charge circuitry is configured to pre-charge the GIO lines to a low power supply voltage potential.

20 Claims, 12 Drawing Sheets

(51) Int. Cl.
*H01L 25/065* (2023.01)
*H01L 25/18* (2023.01)

(58) Field of Classification Search
CPC ....... G11C 11/4096; G11C 11/41; G11C 7/02;
G11C 7/1012; G11C 7/1045; G11C
7/1048; G11C 7/1051; G11C 7/106;
G11C 7/1069; G11C 7/1078; G11C 8/10;
G11C 8/16
See application file for complete search history.

(56) References Cited

U.S. PATENT DOCUMENTS

| | | |
|---|---|---|
| 2023/0005854 A1 | 1/2023 | Simsek-Ege et al. |
| 2023/0005855 A1 | 1/2023 | Simsek-Ege |
| 2023/0005902 A1 | 1/2023 | Simsek-Ege et al. |
| 2023/0005903 A1 | 1/2023 | Simsek-Ege et al. |
| 2023/0005932 A1 | 1/2023 | Simsek-Ege et al. |
| 2023/0005933 A1 | 1/2023 | Simsek-Ege |
| 2023/0060512 A1 | 3/2023 | Simsek-Ege |

OTHER PUBLICATIONS

He et al., "Microelectronic Devices Including Control Logic Circuitry Overlying Memory Arrays, and Related Memory Devices and Electronic Systems", filed Mar. 18, 2022, U.S. Appl. No. 17/698,558, 44 pages.

Simsek-Ege, "Methods of Forming Microelectronic Devices, and Related Microelectronic Devices and Electronic Systems", filed Sep. 7, 2022, U.S. Appl. No. 17/930,388, 77 pages.

* cited by examiner

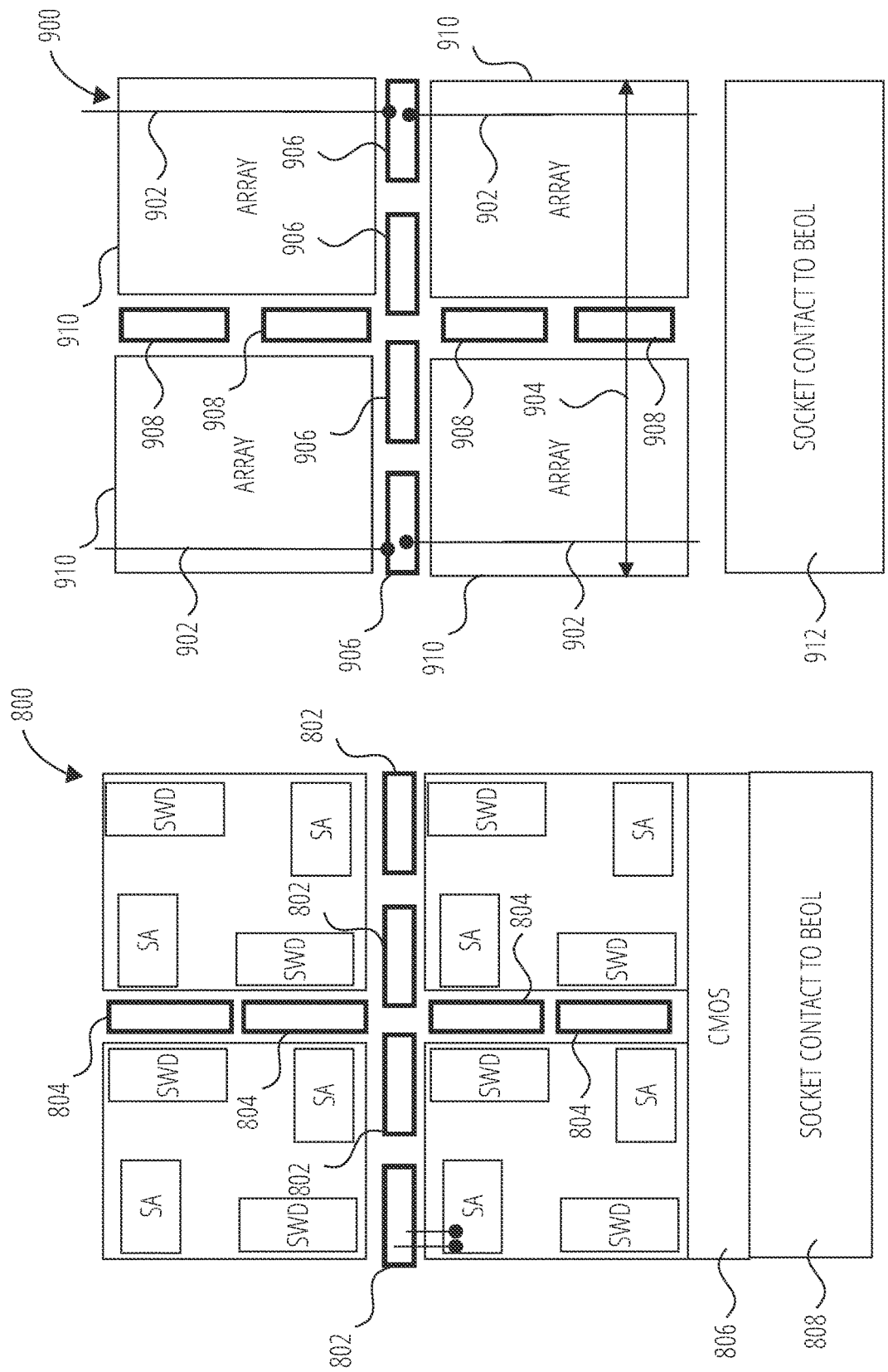

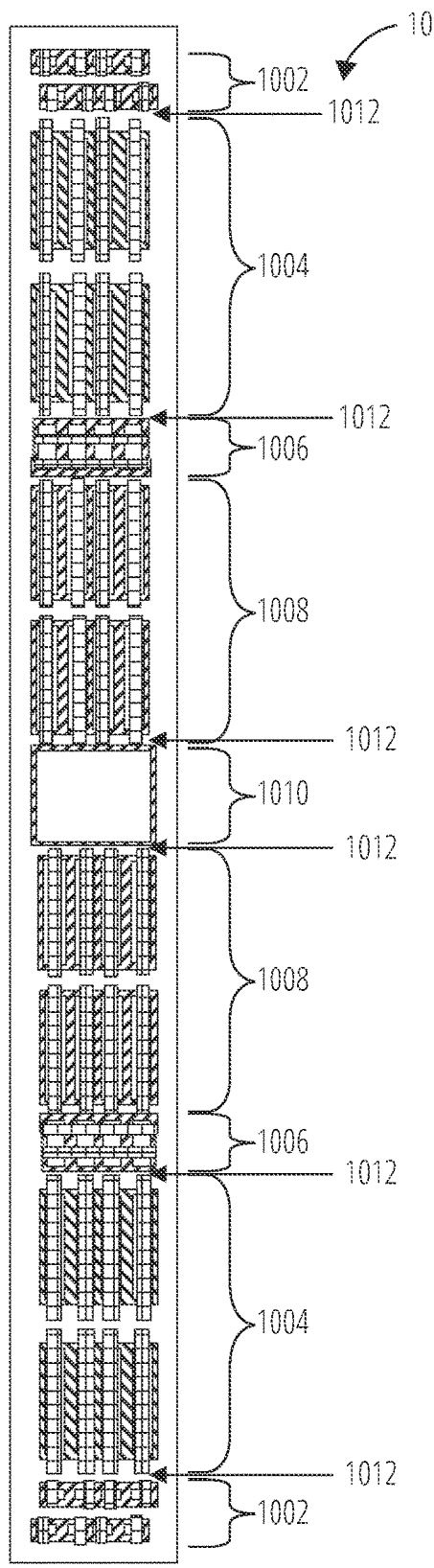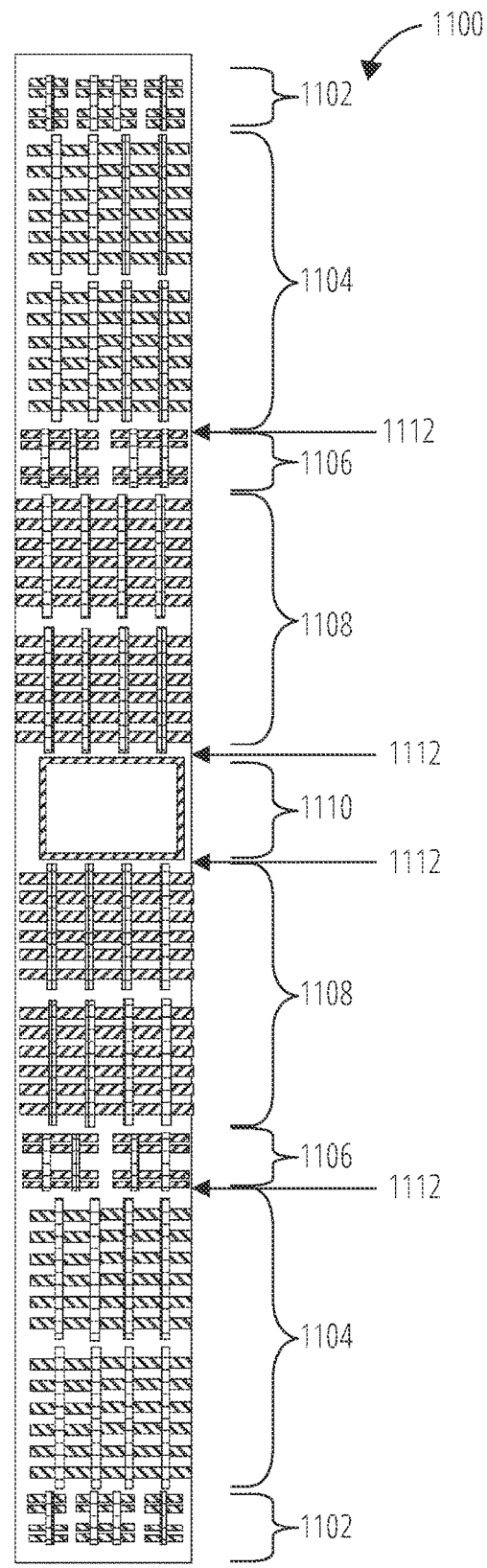
FIG. 10
FIG. 11

FIN FIELD EFFECT TRANSISTOR SENSE AMPLIFIER CIRCUITRY AND RELATED APPARATUSES AND COMPUTING SYSTEMS

TECHNICAL FIELD

This disclosure relates generally to fin field effect transistor (FinFET) sense amplifier circuitry used with global input/output (GIO) lines that are pre-charged to a low power supply voltage potential.

BACKGROUND

Memory devices are used in computing systems to temporarily store data and make the stored data available to processing circuitry during operation of the computing systems. Memory devices include data storage elements and control circuitry, which is electrically connected to the data storage elements through access lines (e.g., digit lines, word lines, without limitation). These memory devices are typically manufactured as semiconductor devices (e.g., using wafers of semiconductor material such as silicon).

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 8 is a simplified plan view of a layout design of the FinFET wafer of FIG. 6, according to some embodiments;

FIG. 9 is a simplified plan view of a layout design of the array wafer of FIG. 6, according to some embodiments;

FIG. 10 is a plan view of a planar transistor example of a chip layout design of a portion of the sense amplifier circuitry of FIG. 8;

FIG. 11 is a plan view of a FinFET example of a chip layout design of a portion of the sense amplifier circuitry of FIG. 8;

DETAILED DESCRIPTION

Figure 1:
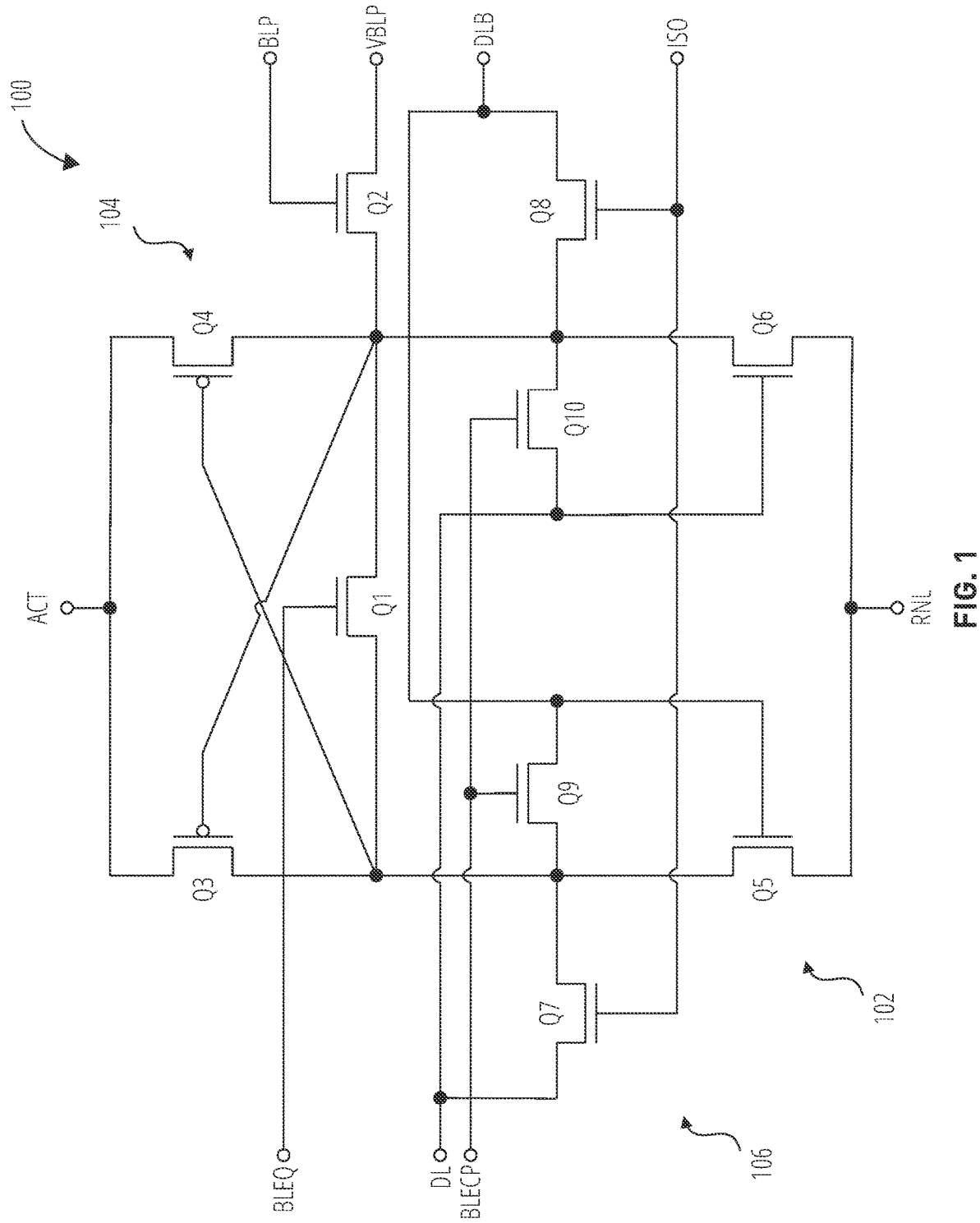
FIG. 1 is a circuit schematic illustration of sense amplifier circuitry, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances, similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "semiconductor material" refers to a material having an electrical conductivity between those of electrically insulating materials and electrically conductive materials. For example, a semiconductor material may have an electrical conductivity of between about 10-8 Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary materials may include combinations of elements from columns III and V of the periodic table of elements (III-V semiconductor materials) or from columns II and VI of the periodic table of elements (II-VI semiconductor materials), without limitation. Semiconductor devices often include crystalline semiconductor materials. By way of non-limiting examples, transistors and diodes include crystalline semiconductor materials.

As used herein, the term "intrinsic semiconductor material" refers to a semiconductor material having a relatively small density of impurities (e.g., a lower density of impurities than electron and hole densities resulting from thermal generation at room temperature).

As used herein, the term "doped semiconductor material" refers to a semiconductor material having a higher density of impurities introduced thereto than intrinsic semiconductor materials (e.g., a higher density of impurities than electron and hole densities resulting from thermal generation at room temperature). A doped semiconductor material may be doped predominantly with donor impurities such as phosphorus (P), antimony (Sb), bismuth (Bi), and arsenic (As), without limitation. Each donor impurity in a crystal lattice of semiconductor material adds a free electron, which increases the conductivity of the semiconductor material relative to the intrinsic form of the semiconductor material. Doped semiconductor materials that have been doped predominantly with donor impurities are referred to herein as "N-type semiconductor materials." A doped semiconductor may instead be doped predominantly with trivalent or acceptor impurities such as boron (B), indium (In), aluminum (Al), and gallium (Ga), without limitation. Each trivalent or acceptor impurity in a crystal lattice of semiconductor material adds an electron hole (referred to herein as "hole"), which increases the conductivity of the semiconductor material relative to the intrinsic form of the semiconductor material. Doped semiconductor materials that have been doped predominantly with trivalent or acceptor impurities are referred to herein as "P-type semiconductor materials."

As used herein, the terms "active material" or "diffusion material" refer to a semiconductor material that has been doped to function as a channel material in a metal oxide semiconductor (MOS) field effect transistor (FET) (MOSFET). A MOSFET transistor having a channel material that has been doped predominantly with donor impurities is referred to herein as an N-type MOS (NMOS) transistor because the active material serving as the channel material for the NMOS transistor includes N-type semiconductor material. Similarly, a MOSFET transistor having a channel material that has been doped predominantly with trivalent or acceptor impurities is referred to herein as a P-type MOS (PMOS) transistor because the active material serving as the channel material for the PMOS transistor includes P-type semiconductor material.

As used herein, the term "threshold voltage potential" refers to a minimum absolute value of a voltage potential difference between a gate terminal and a source terminal of a MOSFET to cause the MOSFET to begin to conduct current between the source terminal and a drain terminal of the MOSFET.

As used herein, the term "low power supply voltage potential" refers to a global or local minimum voltage potential provided by a power supply, sometimes known as "VSS." Similarly, the term "high power supply voltage potential" refers to a global or local maximum voltage potential provided by a power supply, sometimes known as "VDD."

Dynamic random-access memory (DRAM) may be implemented using a three-dimensional (3D) architecture. For example, an array wafer including DRAM memory cells may be bonded to a control wafer including control circuitry for controlling the DRAM memory cells of the array wafer. With the array wafer bonded to the control wafer, a wafer on wafer (WoW) architecture is used.

Since the array wafer is separate from the control wafer before bonding, the array wafer and the control wafer may be manufactured using different processes. The array wafer and the control wafer may then be bonded together using either an oxide or hybrid bonding (e.g., metal-to-metal and oxide-to-oxide bonding, without limitation). As a result, processes that may be detrimental to a first one of the wafers may be used to manufacture a second one of the wafers without the detriment to the first one of the wafers. By way of non-limiting example, if one of the wafers is sensitive to heat that is applied to the other of the wafers during processing of the other of the wafers, the wafers may be separately manufactured without applying the heat to the sensitive wafer. The wafers may then be bonded together to electrically connect their circuitries together. The resulting 3D structure may occupy less chip area than if the circuitries were all implemented into the same wafer because the circuitries are vertically stacked. Accordingly, 3D DRAM may generally have a reduced chip area as compared to two-dimensional DRAM.

A chip area of 3D DRAM may be further reduced by using P-type transistors for column select (CS) gates in conjunction with fin field effect transistor (FinFET) implemented sense amplifier circuitry. The use of P-type transistors for CS gates may reduce the amount of chip area occupied by control circuitry because, assuming the CS gates are positioned adjacent to P-type transistors of pull-up portions of the sense amplifiers, no shallow trench isolation (STI) may be used between the P-type transistors of the pull-up portions and the CS gates. Since STI consumes valuable chip area, obviating the need for STI by using P-type transistors for the CS gates reduces the chip area of the control circuitry. In contrast, if N-type transistors were instead used, STI would be required to separate the N-type devices from the P-type devices, and a larger chip area would be occupied for the control circuitry.

The use of FinFET sense amplifier circuitry may reduce the amount of chip area occupied by control circuitry because the use of FinFET sense amplifier circuitry may obviate a need for voltage threshold compensation (VTC) transistors. Specifically, P-type FinFETs used in the sense amplifier circuitry may be designed to have substantially the same threshold voltage potential as N-type FinFETs used in the sense amplifier circuitry. Chip area may therefore be reduced because VTC transistors may not be used in the sense amplifiers. By contrast, if a semiconductor on insulator (SOI) complementary metal-oxide-semiconductor (CMOS) is used, a threshold voltage potential mismatch between the N-type transistors and the P-type transistors may require that VTC transistors be used, which may result in a larger chip area occupied for the control circuitry.

In addition to the use of P-type CS gates and FinFET transistors in the sense amplifier circuitry, a logic level low pre-charge state of global input/output (GIO) terminals may be used. Power consumption of VTC sensing and reduced standby and off power consumption may result. Accordingly, various embodiments disclosed herein may exhibit reduced chip area and power consumption as compared to conventional devices.

In some embodiments, an apparatus includes a pull-up sense amplifier, a pull-down sense amplifier, column select gates, global input-output (GIO) lines, and GIO pre-charge circuitry. The pull-up sense amplifier includes P-type FinFETs having a first threshold voltage potential associated therewith. The pull-down sense amplifier includes N-type FinFETs having a second threshold voltage potential associated therewith. The second threshold voltage potential is substantially equal to the first threshold voltage potential. The GIO lines are electrically connected to the pull-up sense amplifier and the pull-down sense amplifier through the column select gates. The GIO pre-charge circuitry is configured to pre-charge the GIO lines to a low power supply voltage potential.

In some embodiments, an apparatus includes sense amplifier circuitry, GIO lines, and GIO pre-charge circuitry. The sense amplifier circuitry is free of threshold voltage potential compensation transistors to compensate for mismatch between N-type and P-type threshold voltage potentials of sense amplifier transistors of the sense amplifier circuitry. The GIO lines are electrically connected to the sense amplifier circuitry through column select gates. The GIO pre-charge circuitry is configured to pre-charge the GIO lines to a low power supply voltage potential.

In some embodiments, an apparatus includes an array wafer and a FinFET wafer. The array wafer includes memory cells. The FinFET wafer includes control circuitry. The FinFET wafer is bonded to the array wafer. The control circuitry includes sense amplifier circuitry implemented with FinFETs and column select gates comprising P-type FinFETs.

In some embodiments, a computing system includes a memory device including a memory array, sense amplifier circuitry, and GIO pre-charge circuitry. The sense amplifier circuitry is electrically connected to the memory array. The sense amplifier circuitry includes FinFETs. The GIO pre-charge circuitry is configured to pre-charge GIO lines of the memory device to a low power supply voltage potential.

FIG. 1 is a circuit schematic illustration of sense amplifier circuitry 100, according to some embodiments. The sense amplifier circuitry 100 includes transistors Q1-Q10. Transistors Q1, Q2, and Q5-Q10 are illustrated as NMOS transistors and transistors Q3 and Q4 are illustrated as PMOS transistors.

The sense amplifier circuitry 100 includes a pull-down sense amplifier 102 and a pull-up sense amplifier 104. The pull-down sense amplifier 102 includes transistor Q5 and transistor Q6. The pull-down sense amplifier 102 is configured to amplify signals read from memory cells electrically connected to a first digit line DL and a second digit line DLB. A gate terminal of transistor Q5 is electrically connected to the second digit line DLB, and a gate terminal of transistor Q6 is electrically connected to the first digit line DL. A drain terminal of transistor Q5 is electrically connected to a drain terminal of transistor Q3, and a drain terminal of transistor Q6 is electrically connected to a drain terminal of transistor Q4. Source terminals of transistors Q5 and Q6 are electrically connected to a common source line RNL. Transistors Q5 and Q6 may be pull-down transistors.

The pull-up sense amplifier 104 includes transistors Q3 and Q4. A drain terminal of transistor Q3 is electrically connected to the drain terminal of transistor Q5, and a drain terminal of transistor Q4 is electrically connected to a drain terminal of transistor Q6. Source terminals of transistors Q3 and Q4 are electrically connected to a common source line ACT. A gate terminal of transistor Q3 is electrically connected to the drain terminals of transistors Q4 and Q6, and a gate terminal of transistor Q4 is electrically connected to the drain terminals of transistors Q3 and Q5. Accordingly, transistors Q3 and Q4 may be cross-coupled transistors. Transistors Q3 and Q4 may also be pull-up transistors.

The sense amplifier circuitry 100 further includes pre-charge circuitry 106 configured to pre-charge the electrical lines at the drain terminals of transistors Q3-Q6 prior to sensing the digit lines (first digit line DL and second digit line DLB) during a read operation. The pre-charge circuitry 106 includes transistors Q7 and Q8 configured to selectively electrically connect and isolate the drain terminals of transistors Q3-Q6 to and from the first digit line DL and the second digit line DLB. Gate terminals of transistors Q7 and Q8 are electrically connected to a sense amplifier isolation line ISO. Accordingly, isolation or connection between the first digit line DL the drain terminals of transistors Q3 and Q5, and between the second digit line DLB and the drain terminals of transistors Q4 and D6 is controlled by asserting a sense amplifier isolation signal on the sense amplifier isolation line ISO.

The pre-charge circuitry 106 also includes transistors Q9 and Q10. Transistor Q9 is electrically connected between the second digit line DLB and the drain terminals of transistors Q3 and Q5. Transistor Q10 is electrically connected between the first digit line DL and the drain terminals of transistors Q4 and Q6. Gate terminals of transistors Q9 and Q10 are electrically connected to a digit line pre-charge control line BLECP. Accordingly, connection and isolation between the second digit line DLB and the drain terminals of transistors Q3 and Q5, and between the first digit line DL and the drain terminals of transistors Q4 and Q6 may be controlled by asserting a digit line pre-charge control signal on the digit line pre-charge control line BLECP.

The pre-charge circuitry 106 further includes transistor Q2 electrically connected between a pre-charge voltage potential line VBLP and the drain terminals of transistors Q4 and Q6. The pre-charge voltage potential line VBLP is configured to provide a pre-charge voltage potential to the drain terminals of transistors Q4 and Q5 prior to sensing the first digit line DL and the second digit line DLB during a read operation. A gate terminal of transistor Q2 is electrically connected to digit line pre-charge control line BLP. Accordingly, connection and isolation of the pre-charge voltage potential line VBLP to and from the drain terminals of transistors Q4 and Q6 may be controlled by asserting a digit line pre-charge control signal on the digit line pre-charge control line BLP.

The pre-charge circuitry 106 also includes transistor Q1, which is electrically connected from between the drain terminals of transistors Q3 and Q5 to between the drain terminals of transistors Q4 and Q6. A gate terminal of transistor Q1 is electrically connected to a bit line equalization line BLEQ. Responsive to an assertion on the bit line equalization line BLEQ, transistor Q1 may electrically connect the drains of transistors Q3 and Q5 to the drains of transistors Q4 and Q6. During a pre-charge operation, electrically connecting the drains of transistors Q3 and Q5 to the drains of transistors Q4 and Q6 may equalize the voltage potential at the drains of transistors Q3 and Q5 with the voltage potential at the drains of transistors Q4 and Q6.

As previously mentioned, transistors Q3 and Q4 are cross-coupled transistors. Transistors Q5 and Q6 are also sometimes cross-coupled transistors (e.g., when the gates of transistors Q9 and Q10 are asserted). In some instances, threshold voltage potentials of the cross-coupled transistors may be mismatched. In such instances, a relatively large charge or discharge current on the digit lines (e.g., the first digit line DL and the second digit line DLB) may result. Also, due to increased capacitance and resistance of digit lines resulting from increased numbers of data charge storage elements being coupled to bit lines as higher-density memory device become more prevalent, a relatively large amount of time may pass as the digit lines charge or discharge. In instances where sufficient time is not allotted to fully charge or discharge the digit lines, sense margin deficiencies may occur. Accordingly, the sense amplifier circuitry 100 is configured to compensate for threshold voltage potential mismatches of cross-coupled transistors (e.g., of transistors Q3 and Q4, and transistors Q5 and Q6).

It should be noted that transistors Q1, Q2, and Q7-Q11 may be either NMOS or PMOS transistors. Accordingly, if any one of these transistors is an NMOS transistor, asserting the gate involves providing a voltage potential to the gate thereof that is at least a threshold voltage potential above the source voltage potential, switching the transistor into a saturation mode to electrically connect the source thereof to the drain thereof. Equally, if any one of these transistors is a PMOS transistor, asserting the gate involves providing a voltage potential to the gate thereof that is at least a threshold voltage potential below the source voltage potential, switching the transistor into a saturation mode to electrically connect the source thereof to the drain thereof. Accordingly, wherever herein it is discussed that a signal at the gate of a transistor is asserted, for PMOS transistors this assertion of the transistor may include providing a logic level low voltage potential to the gate and for NMOS transistors this assertion may include providing a logic level high voltage potential to the gate. Also, "turning on" a transistor refers to applying appropriate voltage potentials to the gate, source, and drain to operate the transistor in the saturation mode in which the source and drain nodes are electrically connected to each other. Further, "turning off" a transistor refers to applying appropriate voltage potentials to the gate, source, and drain to operate the transistor in a cutoff mode during which the transistor conducts negligible current between the source and the drain.

Although inclusion of transistor Q1, which may be a threshold voltage compensation (VTC) transistor, may at least partially compensate for the threshold voltage potential mismatch between the pull-up transistors of the pull-up sense amplifier 104 and the pull-down transistors of the pull-down sense amplifier 102, Q1 occupies chip area. Accordingly, each instance of the VTC transistor Q1 for each instance of the sense amplifier circuitry 100 in a memory device adds additional area, which is contrary to a market demand to decrease chip area.

Figure 2:
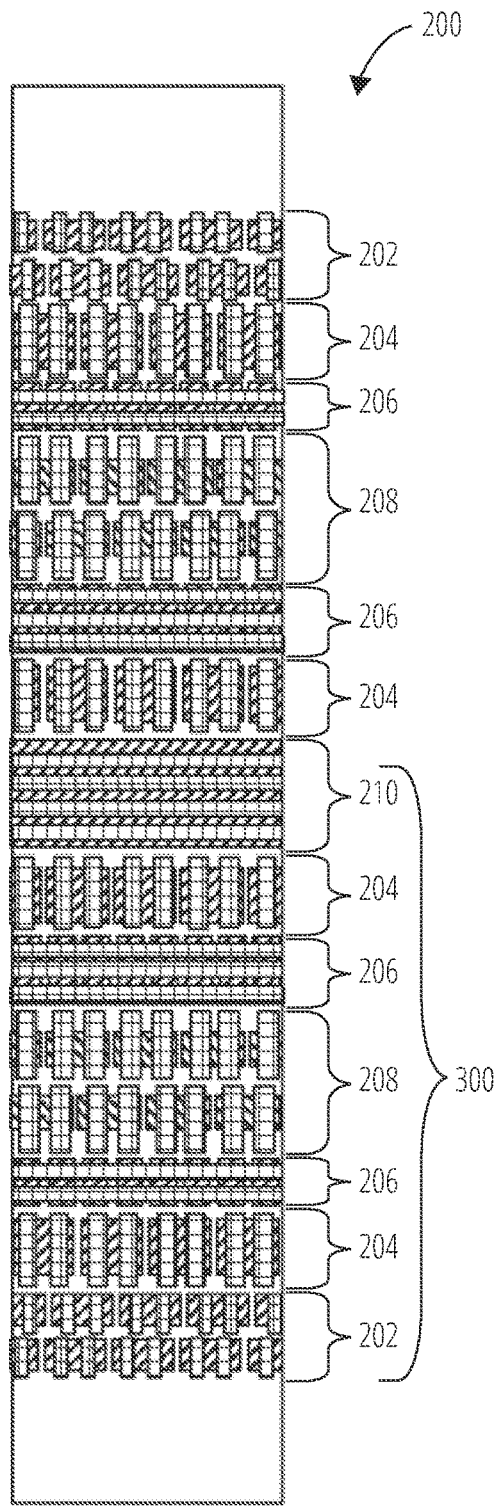
FIG. 2 is a simplified plan view of a portion of an example of a chip layout design for a memory device including multiple instances of the sense amplifier circuitry of FIG. 1.

FIG. 2 is a simplified plan view of a portion of an example of a chip layout design 200 for a memory device including multiple instances of the sense amplifier circuitry 100 of FIG. 1. The portion of the chip layout design 200 illustrated in FIG. 2 includes column select gate regions 202, pull-down sense amplifier regions 204, VTC regions 206, pull-up sense amplifier regions 208, and a gap region 210. The column select gate regions 202 include devices (e.g., transistors, without limitation) that serve as column select devices (e.g., the column select transistors 1202 of FIG. 12) that selectively electrically connect digit lines (e.g., first digit line DL and second digit line DLB) to local input/output (LIO) lines (e.g., LIO and LIOF of FIG. 12). The pull-down sense amplifier regions 204 include pull-down transistors (e.g., Q5 and Q6 in FIG. 1) of multiple instances of the pull-down sense amplifier 102 of FIG. 1. The VTC regions 206 include multiple instances of VTC transistors such as transistor Q1 of FIG. 1. The pull-up sense amplifier regions 208 include pull-up transistors (e.g., Q3 and Q4 in FIG. 1) of multiple instances of the pull-up sense amplifier 104 of FIG. 1.

Figure 3:
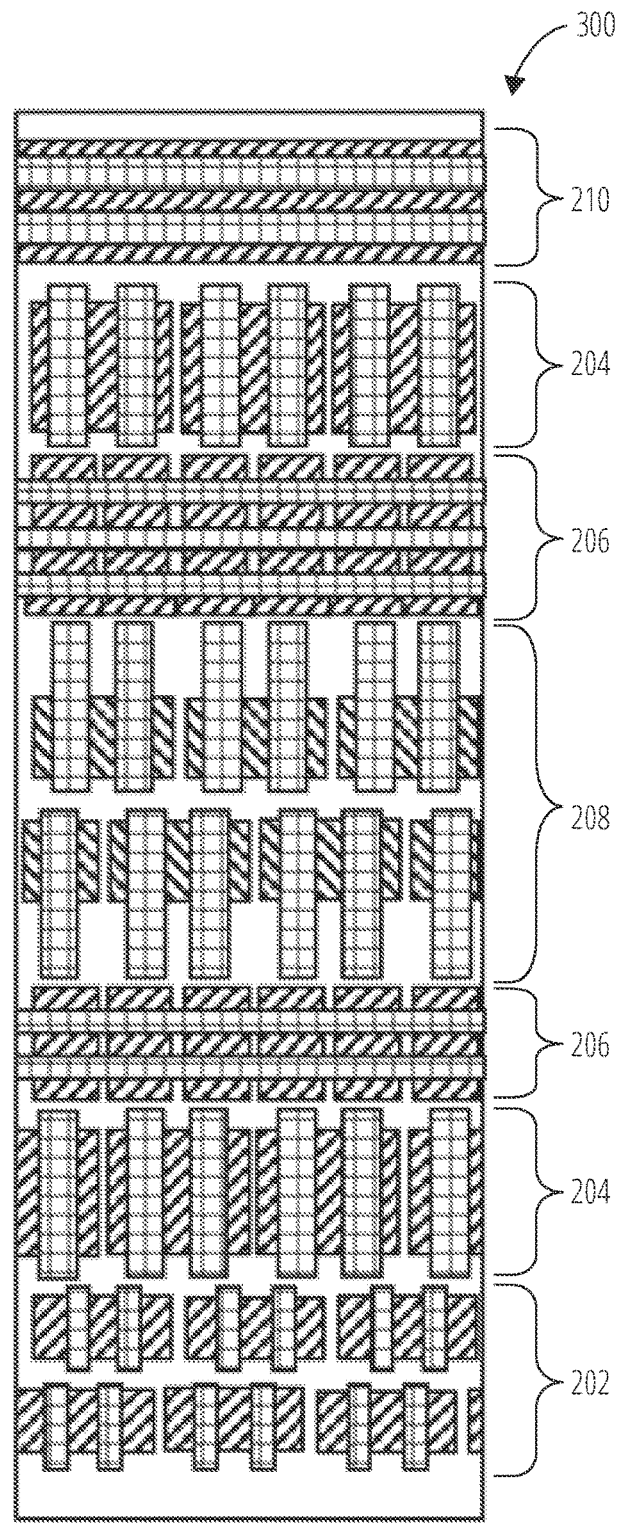
FIG. 3 is a simplified plan view of an enlarged version of a portion of the chip layout design of FIG. 2.

FIG. 3 is a simplified plan view of an enlarged version of a portion 300 of the chip layout design 200 of FIG. 2. FIG. 3 illustrates a portion of the gap region 210, some pull-down sense amplifier regions 204, some VTC regions 206, and a pull-up sense amplifier region 208 of the chip layout design 200 of FIG. 2. In FIG. 2 and FIG. 3, areas shaded using upward sloping hatching (upward from left to right) represent N-type diffusion materials, areas shaded using downward sloping hatching (downward from left to right) represent P-type diffusion materials, and areas shaded using vertical and horizontal hatching represent gate materials.

Referring to FIG. 2 and FIG. 3 together, the amount of chip area occupied by the VTC regions 206 may be observed. The use of CMOS transistors in the pull-down sense amplifier regions 204 and the pull-up sense amplifier regions 208 may result in threshold voltage potential mismatch between the N-type devices in the pull-down sense amplifier region 204 and the P-type devices in the pull-up sense amplifier region 208. Accordingly, the use of CMOS transistors in the pull-down sense amplifier regions 204 and the pull-up sense amplifier regions 208 may lead to the use of the VTC transistors in the VTC regions 206, which as discussed above, occupy valuable chip area.

Figure 4:
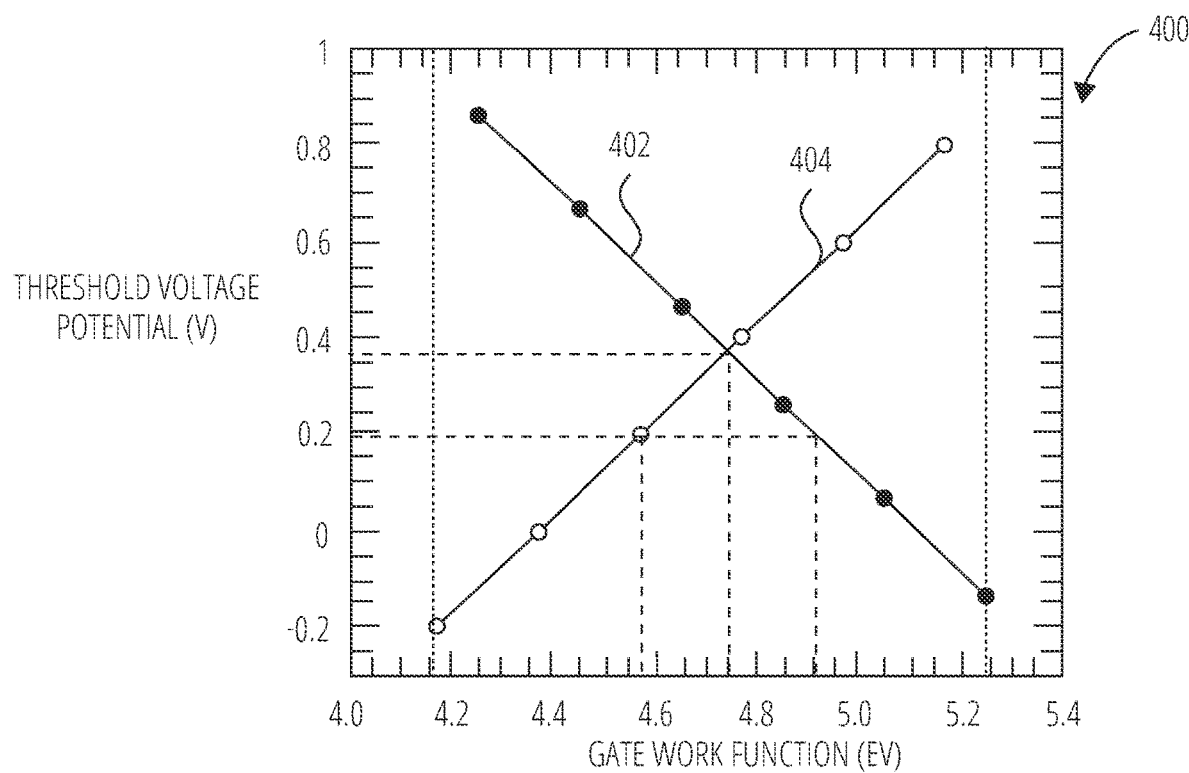
FIG. 4 is a plot of example FinFET threshold voltage potentials for PMOS and NMOS devices plotted as a function of a gate work function.

FIG. 4 is a plot 400 of example FinFET threshold voltage potentials for PMOS and NMOS devices plotted as a function of a gate work function. The plot includes PMOS threshold voltage potentials 402 and NMOS threshold voltage potentials 404 in Volts (V) plotted against gate work function in electron volts (eV). A hole mobility in P-type semiconductor material of FinFETs may be improved as compared to that of planar PMOS transistors. Accordingly, as may be observed in FIG. 4, the threshold voltage potentials for P-type and N-type FinFETs may be substantially symmetric. As a result, FinFETs may be used for the pull-up sense amplifier (e.g., the pull-up sense amplifier 104 of FIG. 1) and the pull-down sense amplifier (e.g., the pull-down sense amplifier 102 of FIG. 1) to reduce and/or eliminate the mismatch between P-type and N-type FinFETs.

By way of non-limiting example, P-type and N-type FinFETs having a gate work function of substantially 4.75 eV may be used, which may result in substantially a 0.4 V threshold voltage potential for both P-type and N-type FinFETs. Also by way of non-limiting example, N-type devices having a gate work function of substantially 4.6 eV and P-type devices having a gate work function of substantially 4.9 eV may be used, which may result in substantially a 0.2 V threshold voltage potential for both P-type and N-type FinFETs.

Figure 5:
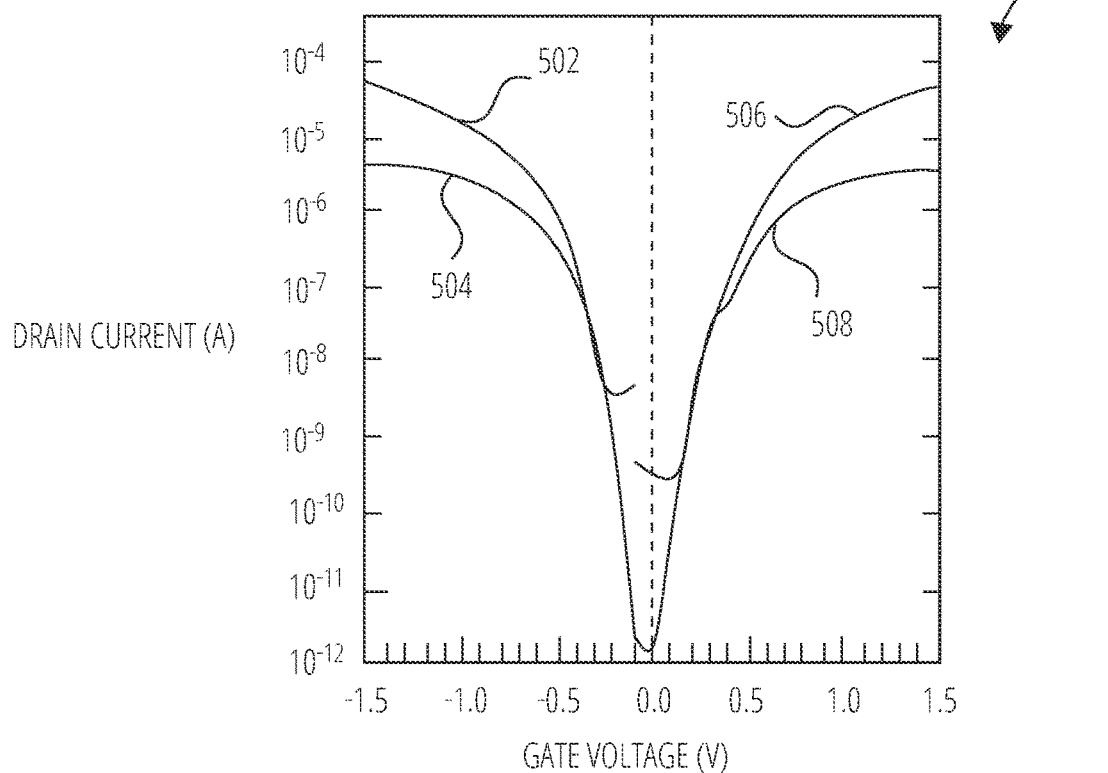
FIG. 5 is a drain current plot illustrating drain currents of FinFET devices plotted against gate voltage potentials.

FIG. 5 is a drain current plot 500 illustrating drain currents of FinFET devices plotted against gate voltage potentials. The drain currents are plotted in amperes (A) and the gate voltage potentials are plotted in volts (V). The drain current plot 500 includes a PMOS 1 V drain current 502, a PMOS 0.05 V drain current 504, an NMOS 1 V drain current 506, and the NMOS 0.05 V drain current 508. As may be seen by observing the drain current plot 500, the PMOS 1 V drain current 502 and the PMOS 0.05 V drain current 504 are substantially mirror reflections of each other over a zero gate voltage potential line.

Figure 6:
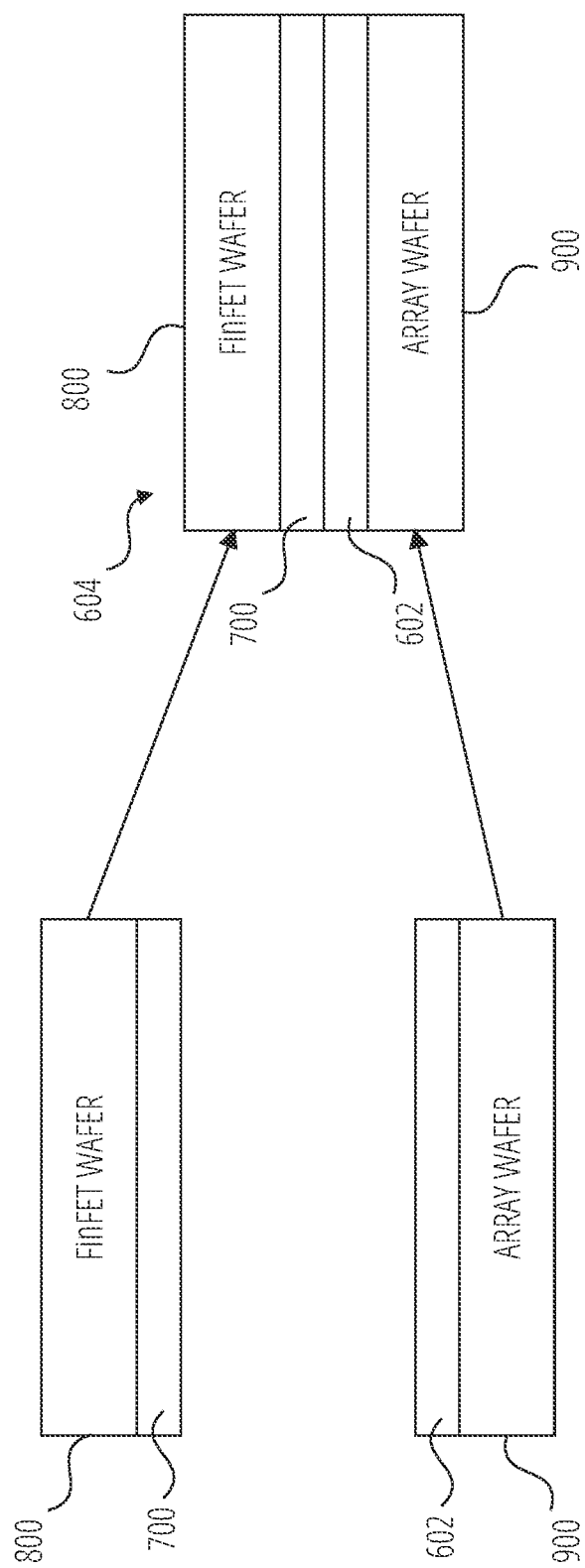
FIG. 6 is simplified conceptual diagram illustrating bonding of an array wafer to a FinFET wafer to form a memory device, according to some embodiments.

FIG. 6 is simplified conceptual diagram illustrating bonding of an array wafer 900 to a FinFET wafer 800 to form a memory device 604, according to some embodiments. The array wafer 900 includes a memory array 602 including data storage elements (e.g., DRAM memory cells, without limitation). The FinFET wafer 800 includes control circuitry 700 (e.g., sense amplifier circuitry, sub word driver circuitry, without limitation). The array wafer 900 and the FinFET wafer 800 may be manufactured separately using different processes, then bonded together to form the memory device 604.

Figure 7:
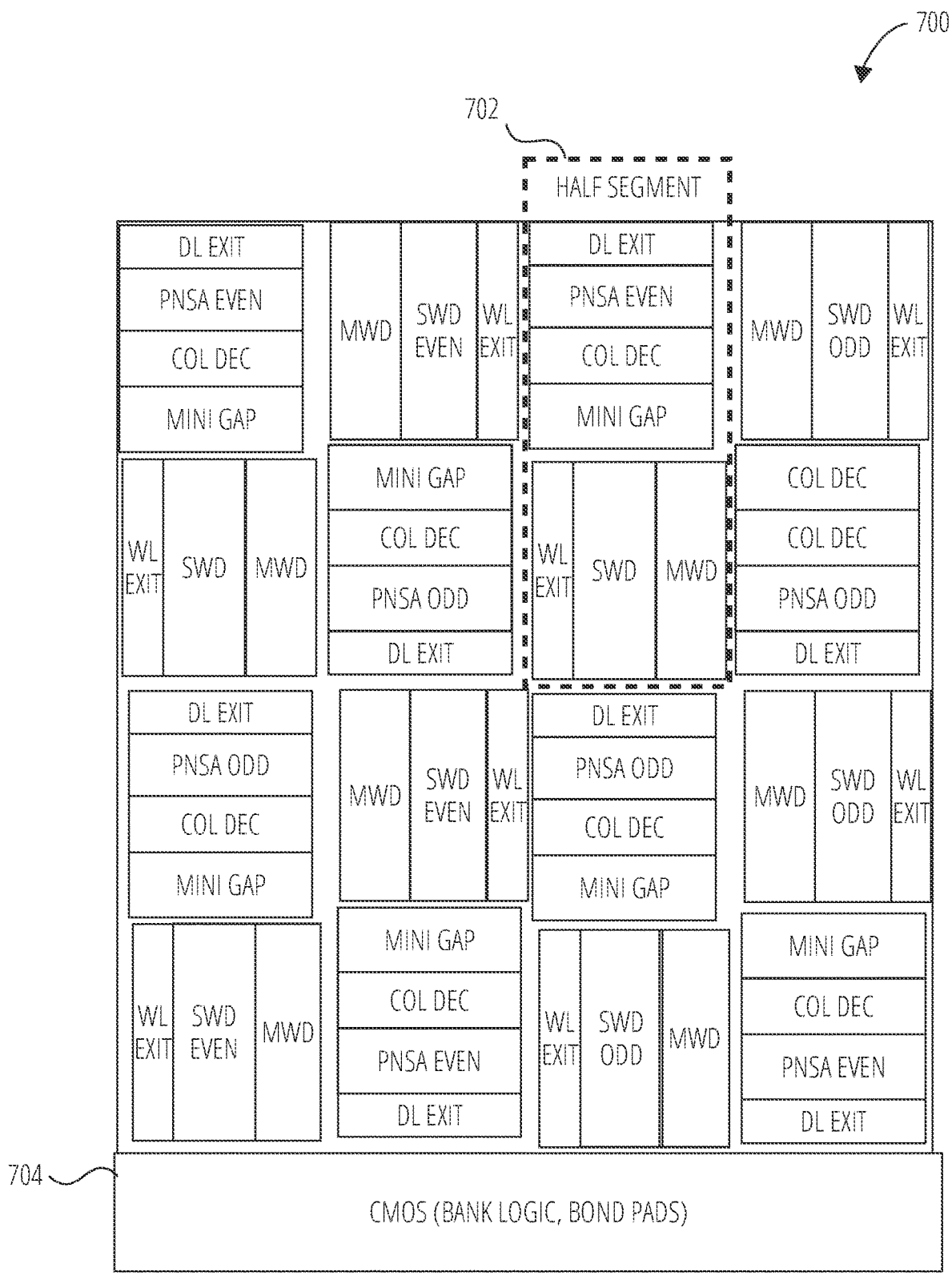
FIG. 7 is a plan view of an example layout design of the control circuitry of the FinFET wafer of FIG. 6, according to various embodiments.

FIG. 7 is a plan view of an example layout design of the control circuitry 700 of the FinFET wafer 800 of FIG. 6, according to various embodiments. The control circuitry 700 includes multiple half segments (e.g., the half segment 702). Eight half segments are illustrated in FIG. 7. Each half segment includes a digit line exit (DL EXIT), even or odd pull-up and pull-down sense amplifiers (PNSA EVEN or PNSA ODD), column decoder circuitry (COL DEC), a mini gap (MINI GAP), main word driver circuitry (MWD), even or odd sub word driver circuitry (SWD EVEN or SWD ODD), and main word driver circuitry (MWD). The control circuitry 700 also includes a CMOS region 704, which may include bank logic and bond pads, without limitation. Four local input/output pairs from the sense amplifier circuitry PNSA to the mini gap may be included. Four global input/output pairs from the mini gap to bank logic of the CMOS region 704 may be included.

FIG. 8 is a simplified plan view of a layout design of the FinFET wafer 800 of FIG. 6, according to some embodiments. The FinFET wafer 800 includes sense amplifier circuitry SA (e.g., including the sense amplifier circuitry 100 of FIG. 1), sub word driver circuitry SWD, DL to SA contact areas 802 to electrically connect the sense amplifier circuitry SA to digit lines 902 of the array wafer 900, and WL to SWD contact areas 804 to electrically connect the sub word driver circuitry SWD to the word lines 904 of the array wafer 900. The FinFET wafer 800 also includes other CMOS circuitry 806 and a socket contact to back end of line (socket contact to BEOL 808).

FIG. 9 is a simplified plan view of a layout design of the array wafer 900 of FIG. 6, according to some embodiments. The array wafer 900 includes array blocks 910, DL to SA contact areas 906, WL to SWD contact areas 908, digit lines 902, and word lines 904. The array blocks 910 may include data storage elements (e.g., DRAM memory cells) at intersections between the digit lines 902 and the word lines 904. With the array wafer 900 bonded to the FinFET wafer 800, the DL to SA contact areas 906 may be bonded to and electrically connected to the DL to SA contact areas 802 of FIG. 8. Also, the WL to SWD contact areas 908 may be bonded to and electrically connected to the WL to SWD contact areas 804 of FIG. 8. Accordingly, the DL to SA contact areas 906 may electrically connect the digit lines 902 to the sense amplifier circuitry SA of FIG. 8 through the DL to SA contact areas 802 of FIG. 8. Also, the DL to SA contact areas 906 may electrically connect the word lines 904 to the sub word driver circuitry SWD through the WL to SWD contact areas 804 of FIG. 8. The array wafer 900 further includes a socket contact to back end of line (BEOL) 912.

As may be observed in FIG. 7, FIG. 8, and FIG. 9, there is relatively little open space on the FinFET wafer 800. If an area occupied by the sense amplifier circuitry SA was reduced, signal voltage potential margin on digit lines may be improved through digit line length reduction. One way to reduce the area of the sense amplifier circuitry SA is to eliminate VTC transistors (e.g., Q1 of FIG. 1), which would eliminate the VTC region 206 of FIG. 2 and FIG. 3. Since the sense amplifier circuitry SA is implemented using FinFETs, the threshold voltage potentials of PMOS and NMOS transistors may be substantially matched, as discussed above with reference to FIG. 4 and FIG. 5, and the VTC transistors may therefore be eliminated. Examples of chip layout designs are illustrated in FIG. 10 and FIG. 11 to compare a planar transistor implementation with a FinFET implementation, both without VTC transistors (e.g., without transistor W1 of FIG. 1). FIG. 10 illustrates a planar transistor implementation whereas FIG. 11 illustrates a FinFET implementation.

FIG. 10 is a plan view of a planar transistor example of a chip layout design 1000 of a portion of the sense amplifier circuitry SA of FIG. 8. The chip layout design 1000 includes NMOS column select gates 1002, pull-up sense amplifier regions 1004, pull-down sense amplifier regions 1008, and a gap region 1010 similar to the column select gate regions 202, the pull-up sense amplifier regions 208, the pull-down sense amplifier regions 204, and the gap region 210 discussed with reference to FIG. 2. The chip layout design 1000 also includes equalization transistor regions 1006 (e.g., such as transistors Q2, Q7-Q10 of FIG. 1, without limitation).

Some of the chip area of the chip layout design 1000 is occupied by shallow trench isolation spaces (STI spaces 1012). By way of non-limiting example, each one of the STI spaces 1012 may consume between substantially 75 and 155 nanometers, vertically, along a horizontal width of the chip layout design 1000. The STI spaces 1012 are positioned between p-type and n-type diffusion materials, and between the gap region 1010 and diffusion materials. For example, STI spaces 1012 are positioned between the NMOS column select gates 1002 and the pull-up sense amplifier regions 1004, between the pull-up sense amplifier regions 1004 and the equalization transistor regions 1006, and between the gap region 1010 and the pull-down sense amplifier regions 1008, for a total of six instances of STI spaces 1012.

In some embodiments, a wider space may be used for those of the STI spaces 1012 that are positioned between diffusion materials of different types (between n-type and p-type diffusion materials). By way of non-limiting example, those of the STI spaces 1012 that are between the NMOS column select gates 1002 and the pull-up sense amplifier regions 1004 and between the pull-up sense amplifier regions 1004 and the equalization transistor regions 1006 may be substantially 155 nanometers across (in the vertical direction from the perspective of FIG. 10). Those of the STI spaces 1012 that are between the gap region 1010 and the pull-down sense amplifier regions 1008 may be substantially 75 nm across.

FIG. 11 is a plan view of a FinFET example of a chip layout design 1100 of a portion of the sense amplifier circuitry SA of FIG. 8. The chip layout design 1100 includes P-type FinFET CS gates 1102, pull-up sense amplifier regions 1104, equalization transistor regions 1106, pull-down sense amplifier regions 1108, and a gap region 1110 similar to the NMOS column select gates 1002, the pull-up sense amplifier regions 1004, the equalization transistor regions 1006, the pull-down sense amplifier regions 1008, and the gap region 1010 discussed above with reference to FIG. 10, except the transistors of the chip layout design 1100 are FinFETs rather than planar devices. Also, the P-type FinFET CS gates 1102 are implemented as P-channel devices rather than N-channel devices.

Some of the chip area of the chip layout design 1100 is occupied by shallow trench isolation spaces (STI spaces 1112). By way of non-limiting example, each one of the STI spaces 1012 may consume between substantially 75 and 155 nanometers, vertically, along a horizontal width of the chip layout design 1100. The STI spaces 1112 are positioned between p-type and n-type diffusion materials, and between the gap region 1110 and diffusion materials. For example, STI spaces 1112 are positioned between the pull-up sense amplifier regions 1104 and the equalization transistor regions 1106, and between the gap region 1110 and the pull-down sense amplifier regions 1108.

It is noted that since the P-type FinFET CS gates 1102 are p-channel devices, no STI space is used between the P-type FinFET CS gates 1102 and the pull-up sense amplifier regions 1104 because both include P-type diffusion materials. In contrast, the chip layout design 1000 of FIG. 10 includes an extra two STI spaces 1012 (six STI spaces 1012) as compared to the four STI spaces 1112 of the chip layout design 1100 due to the mismatch of diffusion material type between the NMOS column select gates 1002 and the pull-up sense amplifier regions 1004. Since the chip layout design 1100 includes fewer STI spaces 1112 than a number of the STI spaces 1012 of the chip layout design 1000, the chip layout design 1100 may be shorter in the vertical dimension from the perspective of FIG. 11. Accordingly, a smaller chip area may be achieved using the chip layout design 1100 rather than using the chip layout design 1000 of FIG. 10.

Similarly as indicated with reference to FIG. 2 and FIG. 3, in FIG. 10 and FIG. 11 areas shaded using upward sloping hatching (upward from left to right) represent N-type diffusion materials, areas shaded using downward sloping hatching (downward from left to right) represent P-type diffusion materials, and areas shaded using vertical and horizontal hatching represent gate materials.

Figure 12:
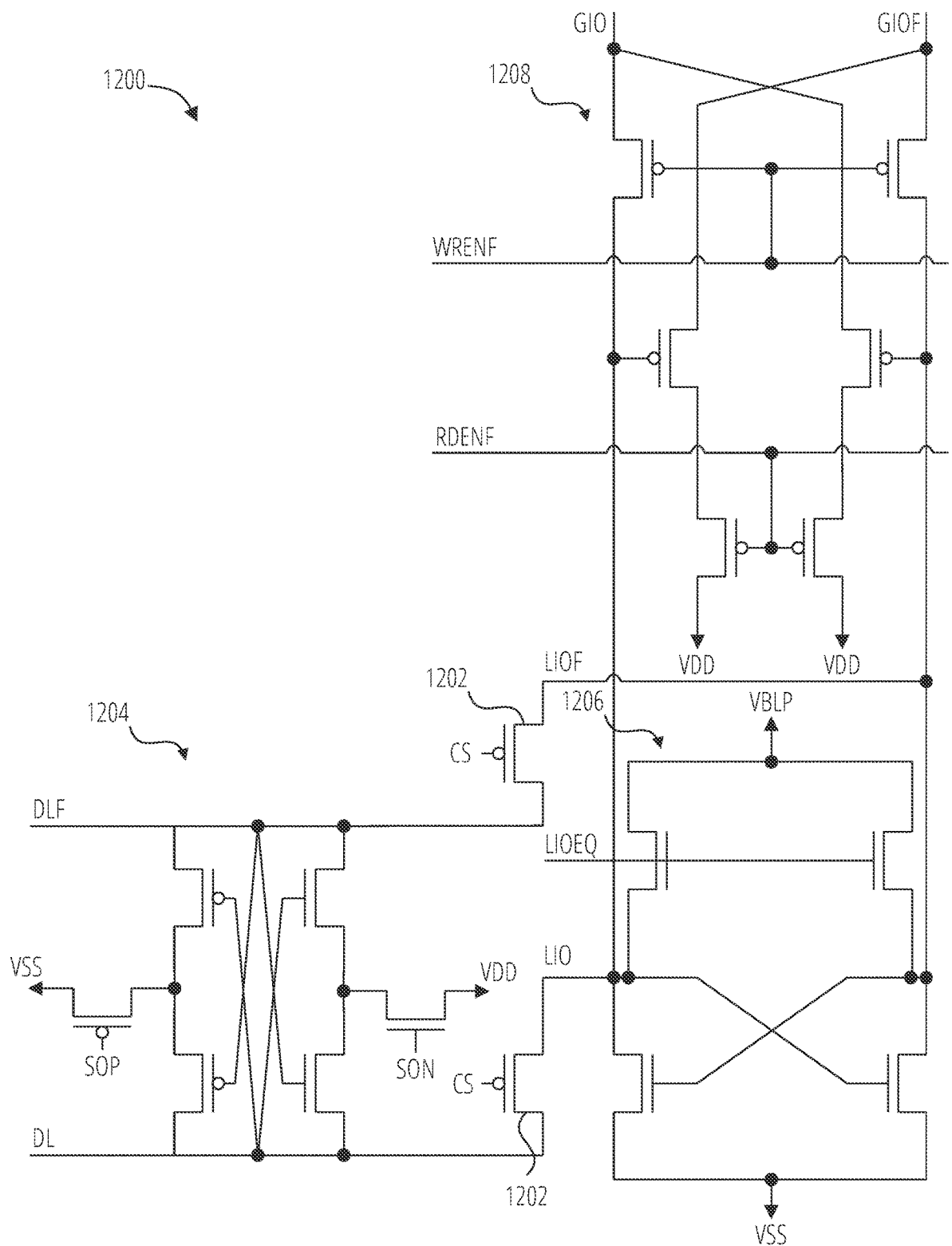
FIG. 12 is a circuit schematic illustration of control circuitry, which is an example of the control circuitry of FIG. 7.

FIG. 12 is a circuit schematic illustration of control circuitry 1200, which is an example of the control circuitry 700 of FIG. 7. The control circuitry 1200 includes digit lines DL, DLF, sense amplifier circuitry 1204, NMOS cross-couple LIO circuitry 1206, LIO lines LIO, LIOF, PMOS write/read circuitry 1208, and GIO lines GIO, GIOF. The NMOS cross-couple LIO circuitry 1206 may pre-charge the LIO lines LIO, LIOF to a voltage potential of VBLP, which may be substantially halfway between a low power supply voltage potential VSS and a high power supply voltage potential VDD. The PMOS write/read circuitry 1208 may operate in a read mode or a write mode responsive to a read-enable signal RDENF and a write-enable signal WRENF. The PMOS write/read circuitry 1208 may pre-charge the GIO lines GIO, GIOF to a low power supply voltage potential VSS. Since the GIO lines GIO, GIOF are pre-charged to the low power supply voltage potential VSS, substantially less current may leak from the GIO lines GIO, GIOF to the low power supply voltage potential terminals than if the GIO lines GIO, GIOF were pre-charged to a high power supply voltage potential VDD or other voltage potential greater than the low power supply voltage potential VSS. Accordingly, the control circuitry 1200 may expend less power than control circuitry that pre-charges GIO lines to a high power supply voltage potential or other voltage potential greater than the low power supply voltage potential.

The sense amplifier circuitry 1204 may be implemented using FinFET transistors. Accordingly, threshold voltage potentials between NMOS and PMOS transistors of the sense amplifier circuitry 1204 may be substantially equal, and VTC transistors may not be included in the sense amplifier circuitry 1204. As a result, the sense amplifier circuitry 1204 may be implemented using less chip area than would be used if the transistors were planar. The sense amplifier circuitry 1204 also includes column select transistors 1202 electrically connecting the digit lines DL, DLF to the LIO lines LIO, LIOF. The column select transistors 1202 are implemented using PMOS transistors, which may accommodate for a smaller chip area than NMOS transistors (e.g., by reducing the number of STI spaces), as discussed above with reference to FIG. 11.

Figure 13:
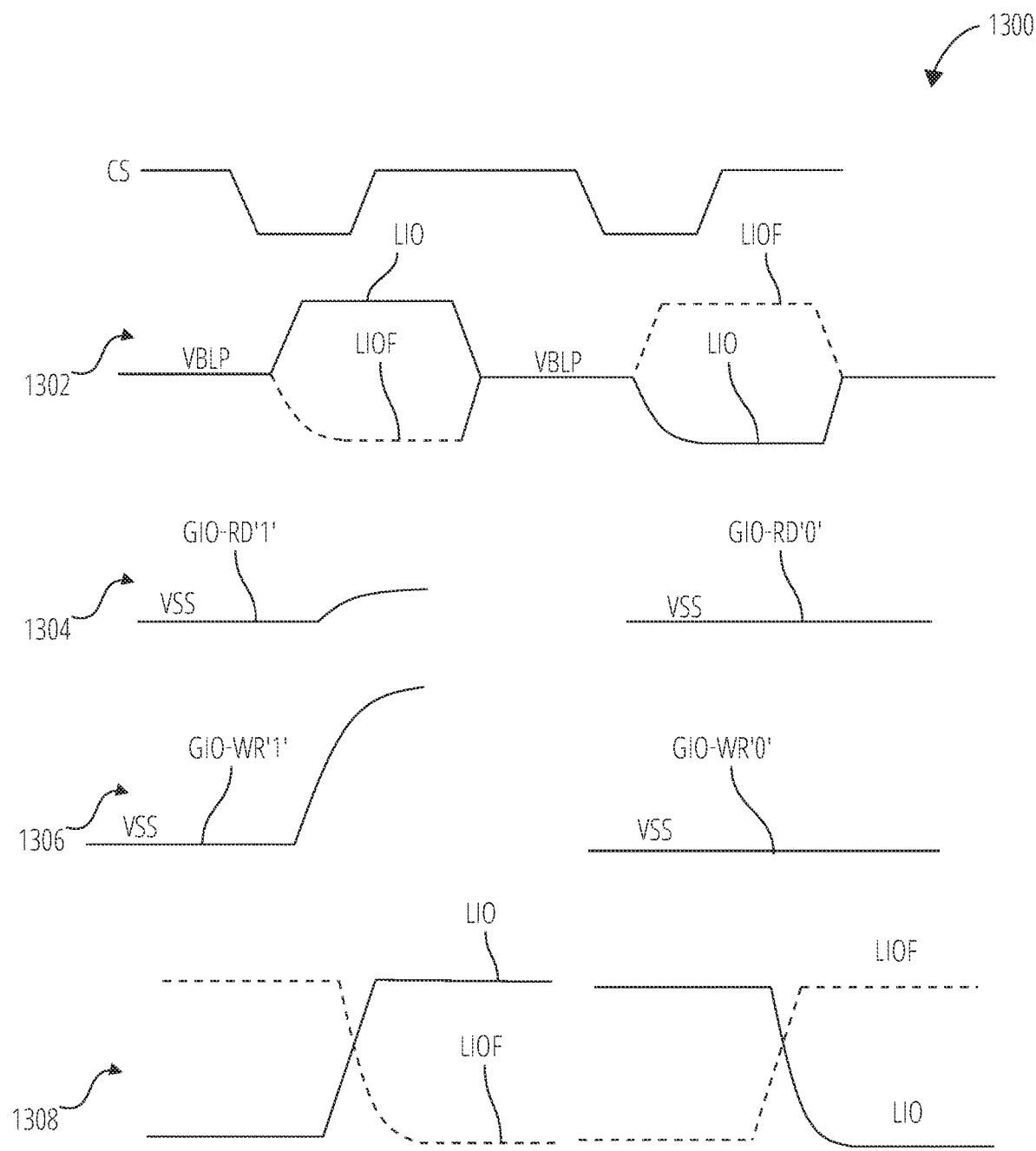
FIG. 13 is a signal timing diagram illustrating examples of signals of the control circuitry of FIG. 12, plotted against time.

FIG. 13 is a signal timing diagram illustrating examples of signals 1300 of the control circuitry 1200 of FIG. 12, plotted against time. The signals 1300 include a CS signal CS, which may be asserted at gate terminals of the column select transistors 1202 of FIG. 12. The control circuitry 1200 also include read operation LIO signals 1302, read operation GIO signals 1304, write operation GIO signals 1306, and write operation LIO signals 1308. The read operation LIO signals 1302 include complementary signals LIO, LIOF that, during read operations, transition from a pre-charge voltage potential VBLP to opposite logic levels. Responsive to a "1" being read during a read operation, the LIO signal may transition from VBLP to a logic level high voltage potential and the LIOF signal may transition from VBLP to a logic level low voltage potential. Responsive to a "0" being read, the LIO signal may transition from VBLP to a logic level low voltage potential and the LIOF signal may transition to a logic level high voltage potential.

The read operation GIO signals 1304 include a read "1" GIO signal GIO-RD'1' and a read "0" GIO signal GIO-RD'0'. Responsive to a "1" being read, GIO-RD'1' may increase from VSS. Responsive to a read "0" operation, GIO-RD'0' may stay substantially at VSS.

The write operation GIO signals 1306 include a write "1" GIO signal GIO-WR'1' and a read "0" GIO signal "GIO-RW" 0'. Responsive to a "1" being written, GIO-WR'1' may transition from VSS toward VDD. Responsive to a "0" being written, GIO-WR'0' may stay substantially at VSS.

The write operation LIO signals 1308 include complementary signals LIO, LIOF that, during write operations, transition between logic level high and low voltage potentials. For example, responsive to a "1" being written during a write operation, the LIO signal may transition from a logic level low voltage potential to a logic level high voltage potential and the LIOF signal may transition from a logic level high voltage potential to a logic level low voltage potential. Responsive to a "0" being written, the LIO signal may transition from a logic level high voltage potential to a logic level low voltage potential and the LIOF signal may transition from a logic level low voltage potential to a logic level high voltage potential.

Figure 14:
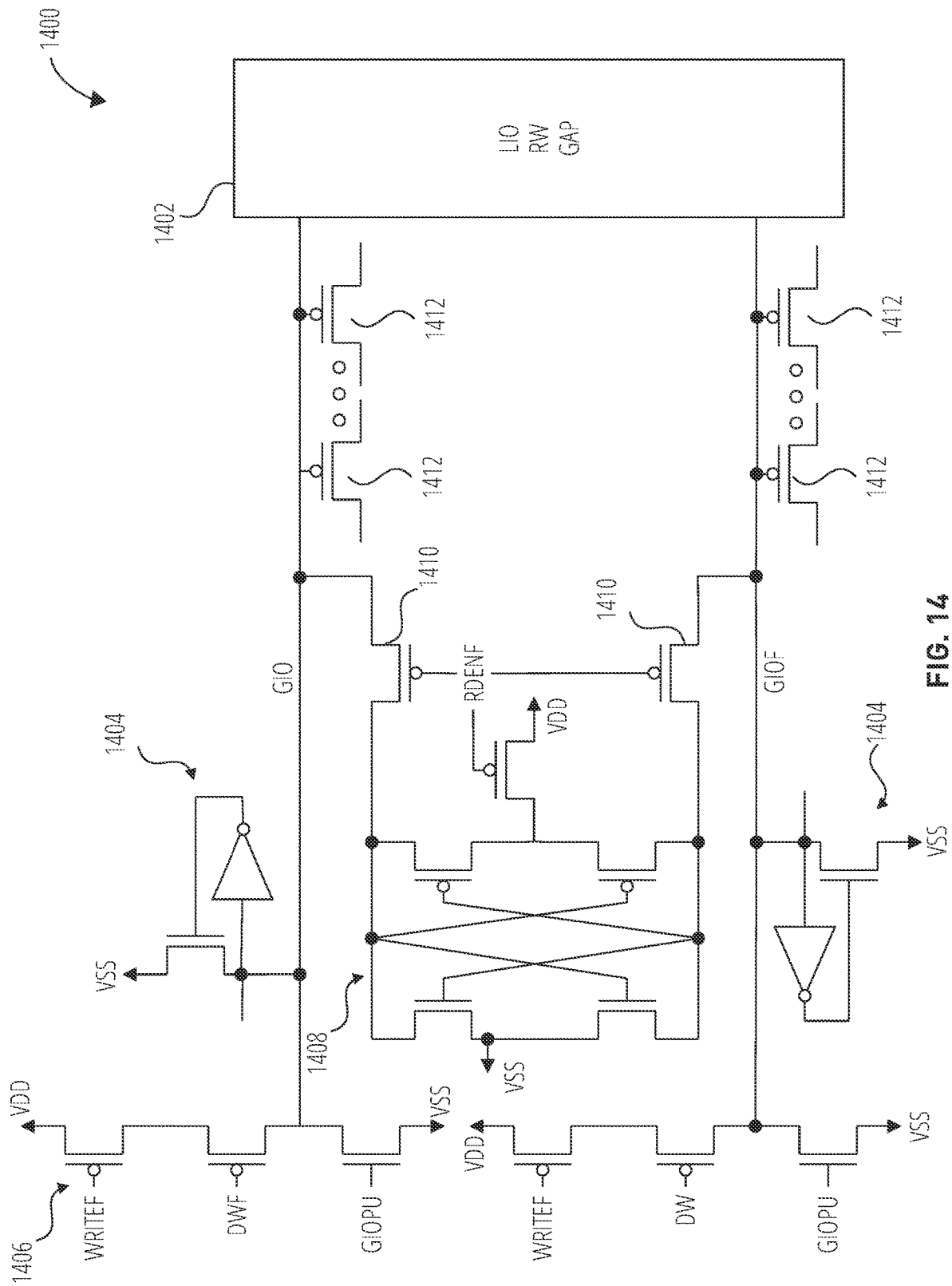
FIG. 14 is a circuit schematic illustration of read/write circuitry, according to some embodiments.

FIG. 14 is a circuit schematic illustration of read/write circuitry 1400, according to some embodiments. The control circuitry 700 of FIG. 7 may include the read/write circuitry 1400, in some embodiments. The read/write circuitry 1400 includes GIO lines GIO, GIOF, LIO circuitry 1402, GIO pre-charge circuitry 1404, GIO control circuitry 1406, GIO amplifier circuitry 1408, CS gates 1410, and additional CS gates 1412. The LIO circuitry 1402 may include, among other things, circuitry similar to the NMOS cross-couple LIO circuitry 1206 of FIG. 12. The GIO pre-charge circuitry 1404 is configured to pre-charge the GIO lines GIO, GIOF to VSS. The GIO control circuitry 1406 is implemented with FinFET transistors. The GIO control circuitry 1406 is configured to control the read/write circuitry 1400 responsive to various signals WRITEF, DWF, GIOPU, and DW.

The GIO amplifier circuitry 1408 is implemented using FinFET transistors. The GIO amplifier circuitry 1408 is configured to drive the GIO lines from VSS to a logic level high or a logic level low corresponding to a "1" or a "0" bit read responsive to a read-enable signal RDENF. The CS gates 1410 are configured to selectively electrically connect and electrically isolate the GIO amplifier circuitry 1408 to and from the GIO lines GIO, GIOF responsive to the read-enable signal RDENF. Since the charge stored by a DRAM memory cell may be relatively small, a voltage potential on the GIO line responsive to a read "1" operation may be relatively small until the GIO amplifier circuitry 1408 turns on and drives the GIO lines GIO, GIOF to a logic level high voltage potential.

The additional CS gates 1412 include multiple pairs of the additional CS gates 1412. Each pair of the additional CS gates 1412 is electrically connected to its own instance of the GIO amplifier circuitry 1408.

Figure 15:
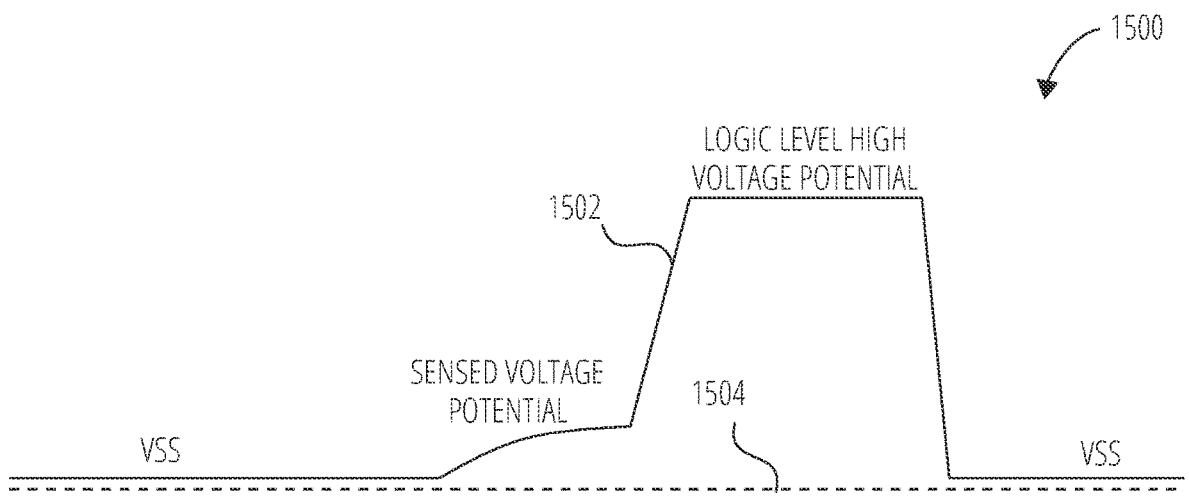
FIG. 15 is a read operation GIO plot illustrating example voltage potentials on the GIO line of FIG. 14 during a read operation.

FIG. 15 is a read operation GIO plot 1500 illustrating example voltage potentials on the GIO line of FIG. 14 during a read operation. The read operation GIO plot 1500 includes a read "1" GIO voltage potential 1502 and a read "0" voltage potential 1504. The read "1" GIO voltage potential 1502 represents a voltage potential on the GIO line responsive to a "1" being read from a memory cell. The read "0" voltage potential 1504 represents a voltage potential on the GIO line responsive to a "0" being read from the memory cell.

Both the read "1" GIO voltage potential 1502 and the read "0" voltage potential 1504 are at substantially VSS during a pre-charge operation. The read "1" GIO voltage potential 1502, however, increases according to a sensed voltage potential responsive to a "1" being read from a memory cell, and the GIO amplifier circuitry 1408 drives the read "1" GIO voltage potential 1502 to a logic level high voltage potential. In contrast, the read "0" voltage potential 1504 remains at VSS after the pre-charge operation responsive to a "0" being read from the memory cell.

Figure 16:
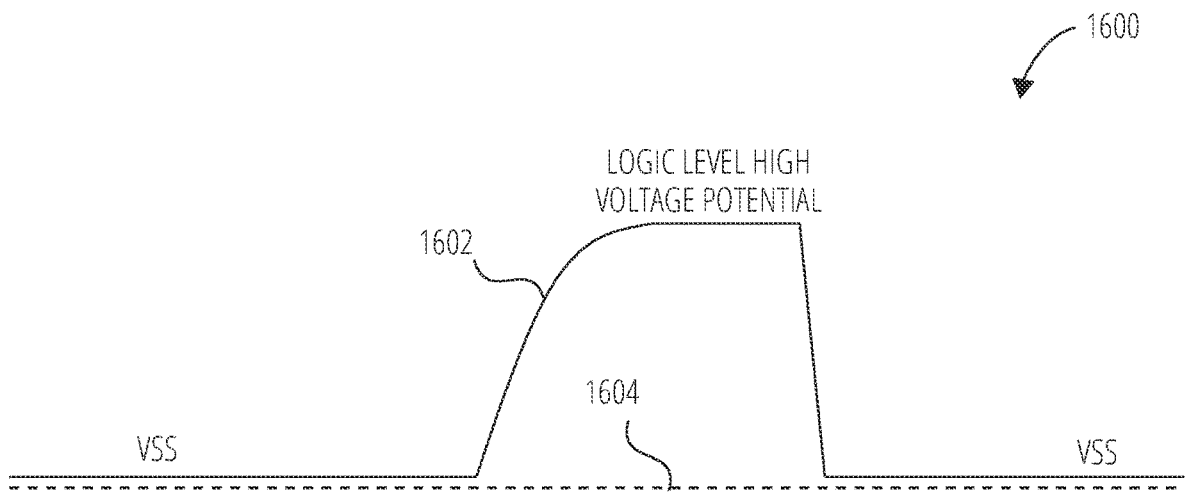
FIG. 16 is a write operation GIO plot illustrating example voltage potentials on the GIO line of FIG. 14 during a write operation.

FIG. 16 is a write operation GIO plot 1600 illustrating example voltage potentials on the GIO line of FIG. 14 during a write operation. The write operation GIO plot 1600 includes a write "1" voltage potential 1602 and a write "0" voltage potential 1604. The write "1" voltage potential 1602 represents a voltage potential on the GIO line responsive to a "1" being written to a memory cell. The write "0" voltage potential 1604 represents a voltage potential on the GIO line responsive to a "0" being written to the memory cell.

Both the write "1" voltage potential 1602 and the write "0" voltage potential 1604 are substantially VSS during a pre-charge operation. The write "1" voltage potential 1602, however, increases to a logic level high voltage potential responsive to the "1" being written to the memory cell. The write "0" voltage potential 1604 remains at VSS responsive to a "0" being written to the memory cell.

Figure 17:
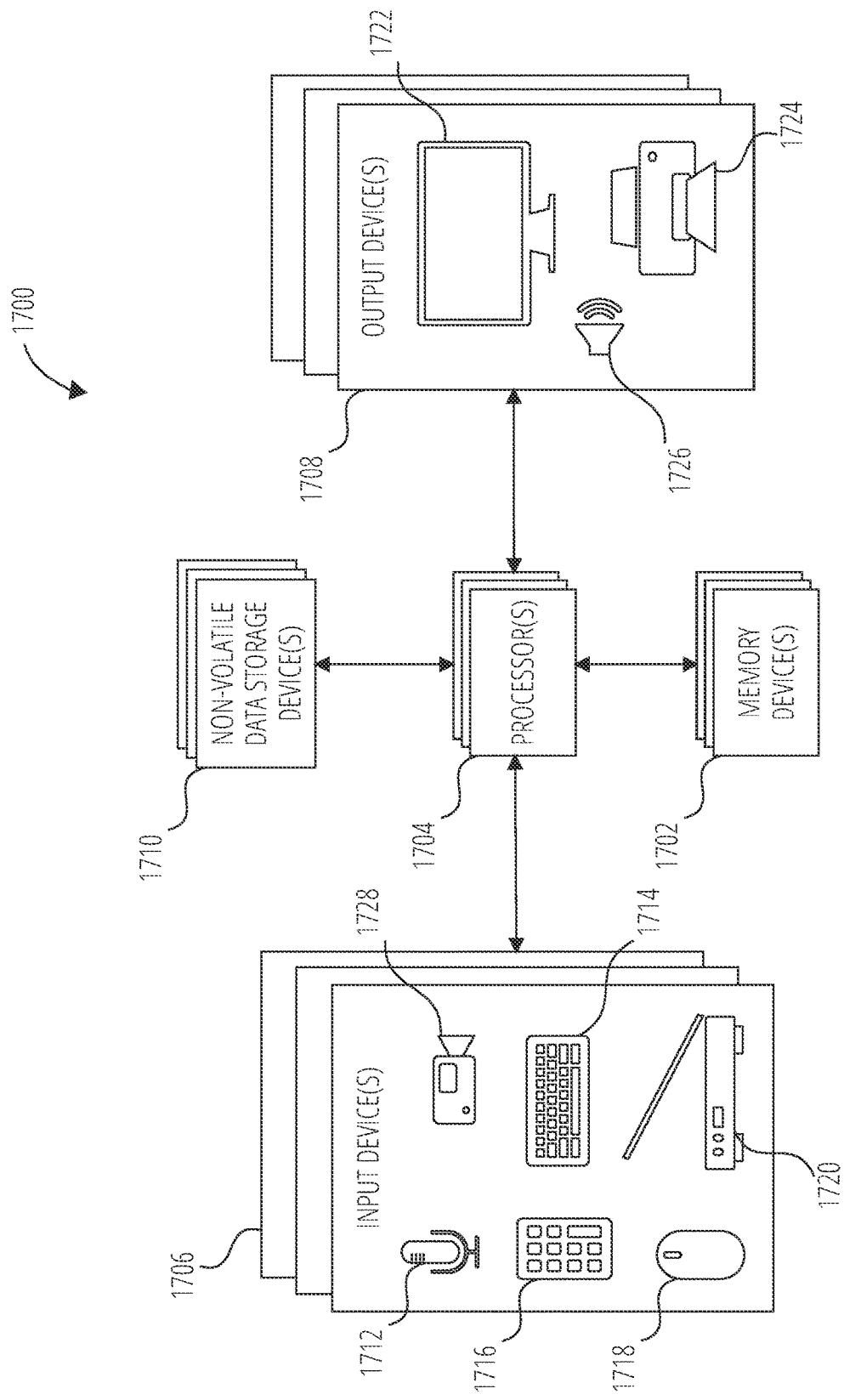
FIG. 17 is a block diagram of a computing system, according to some embodiments.

FIG. 17 is a block diagram of a computing system 1700, according to some embodiments. The computing system 1700 includes one or more processors 1704 operably coupled to one or more memory devices 1702, one or more non-volatile data storage devices 1710, one or more input devices 1706, and one or more output devices 1708. In some embodiments, the computing system 1700 includes a personal computer (PC) such as a desktop computer, a laptop computer, a tablet computer, a mobile computer (e.g., a smartphone, a personal digital assistant (PDA), etc.), a network server, or other computer device.

In some embodiments, the one or more processors 1704 may include a central processing unit (CPU) or other processor configured to control the computing system 1700. In some embodiments, the one or more memory devices 1702 include random-access memory (RAM), such as volatile data storage (e.g., dynamic RAM (DRAM) static RAM (SRAM), etc.). In some embodiments, the one or more non-volatile data storage devices 1710 include a hard drive, a solid-state drive, Flash memory, erasable programmable read-only memory (EPROM), other non-volatile data storage devices, or any combination thereof. In some embodiments, the one or more input devices 1706 include a keyboard 1714, a pointing device 1718 (e.g., a mouse, a track pad, etc.), a microphone 1712, a keypad 1716, a scanner 1720, a camera 1728, other input devices, or any combination thereof. In some embodiments, the output devices 1708 include an electronic display 1722, a speaker 1726, a printer 1724, other output devices, or any combination thereof.

In some embodiments, the one or more memory devices 1702 include a memory array, sense amplifier circuitry, and GIO pre-charge circuitry. The sense amplifier circuitry is electrically connected to the memory array. The sense amplifier circuitry includes FinFETs. The GIO pre-charge circuitry is configured to pre-charge GIO lines of the memory device to a low power supply voltage potential.

In some embodiments, the FinFETs of the sense amplifier circuitry include P-type FinFETs and N-type FinFETs. A first threshold voltage potential associated with the P-type FinFETs is substantially equal to a second threshold voltage potential associated with the N-type FinFETs.

In some embodiments, the FinFETs of the sense amplifier circuitry include P-type FinFETs and N-type FinFETs. The sense amplifier circuitry is free of threshold voltage potential compensation transistors to compensate for a mismatch between a first threshold voltage potential associated with the P-type FinFETs and a second threshold voltage potential associated with the N-type FinFETs.

In some embodiments, the one or more memory devices 1702 further include column select gates including P-type FinFETs electrically connected to the GIO lines.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   a pull-up sense amplifier comprising P-type fin field effect transistors (FinFETs) having a first threshold voltage potential associated therewith;
   a pull-down sense amplifier comprising N-type FinFETs having a second threshold voltage potential associated therewith, the second threshold voltage potential substantially equal to the first threshold voltage potential;
   column select gates;
   global input-output (GIO) lines electrically connected to the pull-up sense amplifier and the pull-down sense amplifier through the column select gates;
   GIO pre-charge circuitry configured to pre-charge the GIO lines to a low power supply voltage potential;
   local input/output (LIO) lines; and
   LIO circuitry configured to pre-charge the LIO lines to a pre-charge voltage potential substantially halfway between the low power supply voltage potential and a high power supply voltage potential.

2. The apparatus of claim 1, wherein the column select gates are positioned adjacent to pull-up sense amplifier regions including the P-type FinFETs.

3. The apparatus of claim 2, wherein the column select gates are P-type field effect transistors.

4. An apparatus, comprising:
   a pull-up sense amplifier comprising P-type fin field effect transistors (FinFETs) having a first threshold voltage potential associated therewith;
   a pull-down sense amplifier comprising N-type FinFETs having a second threshold voltage potential associated therewith, the second threshold voltage potential substantially equal to the first threshold voltage potential;
   column select gates positioned adjacent to pull-up sense amplifier regions including the P-type FinFETs, a space between the column select gates and the adjacent pull-up sense amplifier regions free of shallow trench isolation spaces;

global input-output (GIO) lines electrically connected to the pull-up sense amplifier and the pull-down sense amplifier through the column select gates; and GIO pre-charge circuitry configured to pre-charge the GIO lines to a low power supply voltage and potential.

5. An apparatus, comprising:
a pull-up sense amplifier comprising P-type fin field effect transistors (FinFETs) having a first threshold voltage potential associated therewith;
a pull-down sense amplifier comprising N-type FinFETs having a second threshold voltage potential associated therewith, the second threshold voltage potential substantially equal to the first threshold voltage potential;
column select gates;
global input-output (GIO) lines electrically connected to the pull-up sense amplifier and the pull-down sense amplifier through the column select gates; and
GIO pre-charge circuitry configured to pre-charge the GIO lines to a low power supply voltage potential,
wherein the pull-up sense amplifier, the pull-down sense amplifier, the column select gates, the GIO lines, and the GIO pre-charge circuitry are formed on a wafer separate from an array wafer including an array of memory cells.

6. The apparatus of claim 5, wherein the wafer is bonded to the array wafer.

7. An apparatus, comprising:
an array structure comprising an array of volatile memory cells; and
a control circuitry structure overlying and bonded to the array structure, the control circuitry structure comprising:
sense amplifier circuitry free of threshold voltage potential compensation transistors to compensate for mismatch between N-type and P-type threshold voltage potentials of sense amplifier transistors of the sense amplifier circuitry;
global input-output (GIO) lines electrically connected to the sense amplifier circuitry through column select gates positioned adjacent to pull-up sense amplifier regions of the sense amplifier circuitry, the control circuitry structure free of shallow trench isolation (STI) spaces between the column select gates and the adjacent pull-up sense amplifier regions; and
GIO pre-charge circuitry configured to pre-charge the GIO lines to a low power supply voltage potential.

8. The apparatus of claim 7, wherein the sense amplifier transistors are fin field effect transistors (FinFETs).

9. The apparatus of claim 8, wherein the FinFETs include P-type transistors having a first threshold voltage potential associated therewith and N-type transistors having a second threshold voltage potential associated therewith, the second threshold voltage potential substantially equal to the first threshold voltage potential.

10. The apparatus of claim 7, wherein the column select gates include P-type fin field effect transistors (FinFETs).

11. The apparatus of claim 10, wherein the pull-up sense amplifier regions include the P-type fin field effect transistors of the sense amplifier transistors.

12. An apparatus, comprising:
an array wafer including memory cells; and
a fin field effect transistor (FinFET) wafer including control circuitry, the FinFET wafer bonded to the array wafer, the control circuitry including:
sense amplifier circuitry implemented with FinFETs; and
column select gates comprising P-type FinFETs and positioned adjacent to pull-up sense amplifier regions on the FinFET wafer, the FinFET wafer free of shallow trench isolation (STI) spaces between the column select gates and the adjacent pull-up sense amplifier regions.

13. The apparatus of claim 12, wherein the sense amplifier circuitry includes N-type FinFETs and P-type FinFETs having substantially equal threshold voltage potentials.

14. The apparatus of claim 12, wherein the sense amplifier circuitry is free of threshold voltage potential compensation transistors.

15. The apparatus of claim 12, wherein the control circuitry includes global input/output (GIO) pre-charge circuitry configured to pre-charge GIO lines to a low power supply voltage potential.

16. The apparatus of claim 12, wherein the array wafer and the FinFET wafer each include digit line to sense amplifier contact areas to electrically connect the sense amplifier circuitry to digit lines of the array wafer.

17. A computing system, comprising:
a memory device including:
a memory array structure comprising a memory array;
a control circuitry structure formed separately from and dielectric-to-dielectric bonded to the memory array structure, the control circuitry structure comprising:
sense amplifier circuitry electrically connected to the memory array, the sense amplifier circuitry comprising:
a pull-up sense amplifier comprising P-type fin field effect transistors (FinFETs); and
a pull-down sense amplifier comprising N-type FinFETs having a threshold voltage potential substantially equal to that of the N-type FinFETs of the pull-up sense amplifier;
column select gates;
global input-output (GIO) lines electrically connected to the pull-up sense amplifier and the pull-down sense amplifier through the column select gates; and
GIO pre-charge circuitry configured to pre-charge the GIO lines to a low power supply voltage potential.

18. The computing system of claim 17, wherein:
the sense amplifier circuitry is free of threshold voltage potential compensation transistors to compensate for a mismatch between a first threshold voltage potential associated with the P-type FinFETs and a second threshold voltage potential associated with the N-type FinFETs.

19. The computing system of claim 17, further comprising column select gates comprise additional P-type FinFETs.

20. The computing system of claim 17, further comprising:
one or more processors electrically connected to the memory device;
one or more input devices electrically connected to the one or more processors;
one or more non-volatile data storage devices electrically connected to the one or more processors; and
one or more output devices electrically connected to the one or more processors.

* * * * *

UNITED STATES PATENT AND TRADEMARK OFFICE
CERTIFICATE OF CORRECTION

| | | Page 1 of 1 |
|---|---|---|
| PATENT NO. | : 12,243,580 B2 | |
| APPLICATION NO. | : 17/936760 | |
| DATED | : March 4, 2025 | |
| INVENTOR(S) | : Yuan He and Fatma Arzum Simsek-Ege | |

It is certified that error appears in the above-identified patent and that said Letters Patent is hereby corrected as shown below:

In the Specification

| | | |
|---|---|---|
| Column 3, | Line 55, | change "(GaAs)), ternary materials may include" to --(GaAs)), ternary compound semiconductor materials (e.g., $Al_XGa_{1-X}As$), and quaternary compound semiconductor materials (e.g., $Ga_XIn_{1-X}As_YP_{1-Y}$), without limitation. Compound semiconductor materials may include-- |
| Column 13, | Lines 8-9, | change "signal GIO-RD'O'. Responsive" to --signal GIO-RD'0'. Responsive-- |
| Column 13, | Lines 10-11, | change "operation, GIO-RD'O' may stay" to --operation, GIO-RD'0' may stay-- |
| Column 13, | Lines 13-14, | change "signal "GIO-RW" 0'. Responsive" to --signal GIO-RW'0'. Responsive-- |

Signed and Sealed this
Twentieth Day of May, 2025

Coke Morgan Stewart
*Acting Director of the United States Patent and Trademark Office*